United States Patent [19]

Teng

[11] Patent Number: 4,947,227
[45] Date of Patent: Aug. 7, 1990

[54] LATCH-UP RESISTANT CMOS STRUCTURE

[75] Inventor: Clarence W. Teng, Plano, Tex.

[73] Assignee: Texas Instruments, Incorporated, Dallas, Tex.

[21] Appl. No.: 776,553

[22] Filed: Sep. 16, 1985

[51] Int. Cl.⁵ ............................................. H01L 27/02
[52] U.S. Cl. ........................................ 357/42; 357/49; 357/52
[58] Field of Search ............................. 357/42, 49, 52

[56] References Cited

U.S. PATENT DOCUMENTS

| 4,507,158 | 3/1985 | Kamins et al. | 357/49 |
| 4,528,462 | 7/1985 | Shackle et al. | 357/49 |
| 4,532,003 | 7/1985 | Beasom | 357/49 |

FOREIGN PATENT DOCUMENTS 54-97384  8/1979  Japan ..................................... 357/42

Primary Examiner—Edward I. Wojciechowicz
Attorney, Agent, or Firm—James T. Comfort; Melvin Sharp; Douglas A. Sorensen

[57] ABSTRACT

A latch-up free CMOS structure and method of fabrication thereof is disclosed. A P-type substrate (40) is appropriately masked to form a plurality of sites in which isolated wells (50) are formed. A thermal oxide layer (56) is grown on the surface of each well (50), and a boron channel stop (62) implanted therearound. Polysilicon semiconductor material (68) is formed within each well, and implant doped to form an N-well (76) of material. The P-substrate (40) is planarized. PMOS transistors are formed within the oxide isolated N-wells (76), while NMOS transistors are formed in the P-substrate (40) outside the wells.

6 Claims, 2 Drawing Sheets

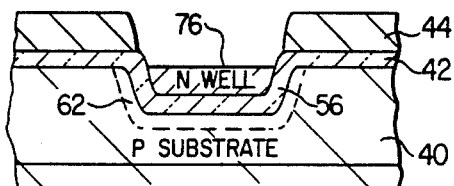
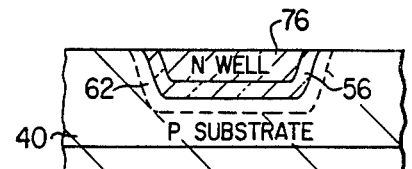
FIG. 8   FIG. 9
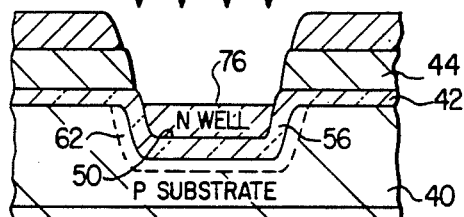
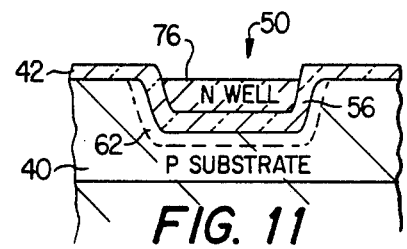
FIG. 10   FIG. 11
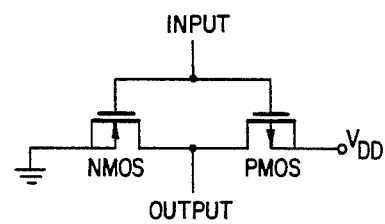
FIG. 13
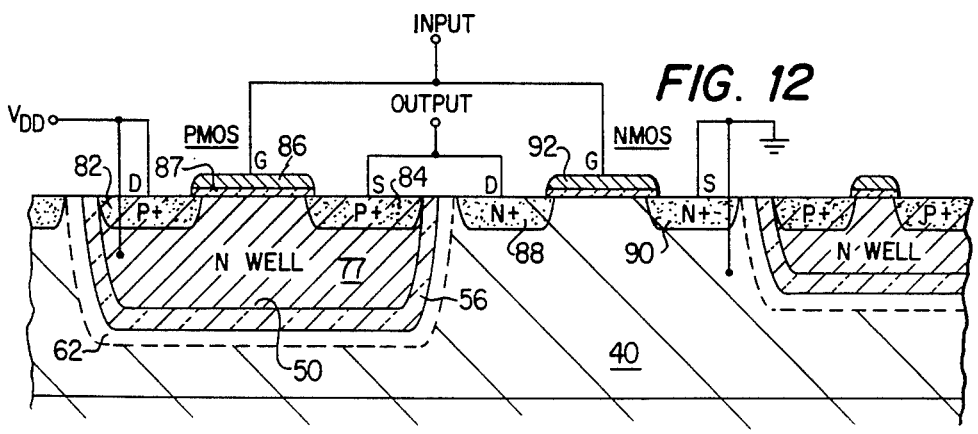
FIG. 12

LATCH-UP RESISTANT CMOS STRUCTURE

TECHNICAL FIELD OF THE INVENTION

The present invention relates in general to a semiconductor structure and the methods of fabrication thereof, and more particularly relates to techniques for electrically isolating semiconductor substrate regions.

BACKGROUND OF THE INVENTION

The ability to fabricate Complementary Metal Oxide Semiconductor (CMOS) circuits has spawned a new generation of integrated circuits. The CMOS technology has made possible the integration of more circuits onto a smaller substrate space.

The principal advantage of the CMOS technology is the use of N-channel and P-channel devices for their complementary characteristics. According to current CMOS fabrication techniques, lateral P-channel and N-channel transistors are formed adjacently in the semiconductor substrate. As the basis for forming these two different types of devices, a P-well and an N-well of semiconductor material are formed in the semiconductor substrate. In addition, the P+ source and drain regions of the PMOS device are formed in the N-well while a corresponding pair of N+ regions are formed in the P-well to provide the NMOS device.

It can be seen that in the CMOS structure there exists a number of lateral P and N junctions which are known to have the characteristics of a SCR type of device. Under certain conditions, sufficient charged particles may flow between the junctions of the so-called parasitic SCR-like device and latch it into a conductive state. It is apparent that when the parasitic SCR device becomes latched, the CMOS circuit is unable to function properly.

The scaling down of CMOS circuits to further miniaturize CMOS transistors and conserve substrate space aggravates the problem of latch-up. In scaling CMOS integrated circuits, the spacing between semiconductor regions is made smaller so that more integrated circuits can occupy a given substrate space. However, because of the closer spacing between various P and N junctions, the parasitic gain increases. Accordingly, the lifetime of the charged particles is such that there is an increased probability of crossing a junction and thereby initiating the triggering of the parasitic SCR.

Various approaches have been taken to circumvent the problem of latch-up in CMOS circuits. Trenches have been used, for example, for separating the P-channel and N-channel devices in an attempt to reduce the gain of the lateral parasitic SCR. Resort has also been had to epitaxial slices to reduce the voltage buildup on the parasitic junctions. Retrograded wells of semiconductor material having a reverse gradient doping level have been employed in an attempt to reduce the carrier lifetime of the charges. In addition, vertically stacked semiconductor structures have been fabricated to physically separate the P-channel and N-channel devices.

While these approaches have had an affect in reducing latch-up in CMOS circuits, a need still exists for providing a structure which is essentially free of the inherent latch-up phenomenon. A concomitant need also exists for a method of fabricating a latch-up free CMOS circuit using conventional technology.

SUMMARY OF THE INVENTION

In accordance with the invention, methods and apparatus are provided for substantially eliminating latch-up in CMOS circuits. The N-well in which the PMOS transistor is formed is fabricated in an oxide isolated well, thereby electrically isolating such transistor from the junctions of an NMOS transistor which is fabricated in an adjacent P-well.

Before any of the semiconductor wells are formed in a P-substrate material, areas are defined where it is desired to fabricate the PMOS transistor of the CMOS circuit. The areas are defined by first growing an oxide layer and nitride layer on the substrate and spinning a resist layer thereover. The layers are patterned to form the well locations. The substrate is then subjected to a plasma etch which removes the silicon substrate and forms a well at each well site. After the resist is removed with chemicals, the substrate is then subjected to a high temperature which oxidizes the silicon substrate at the well sites to thereby form a thermal oxide isolation layer in each well. Boron is then implanted through the oxide isolation walls into the silicon substrate to form a channel stop and thereby prevent parasitic sidewall channels.

Each well formed by the oxide isolation is filled with polysilicon, or amorphous silicon, to provide the well of material in which the PMOS transistor will be formed. The top surface of the semiconductor substrate is next planarized to provide a surface topography acceptable for subsequent processing. The polysilicon or amorphous silicon is doped with phosphorus by ion implantation to form the N-well of material. The P-substrate material itself provides the P-well in which the NMOS transistor is formed. PMOS and NMOS transistors are conventionally formed within the respective isolated N-wells and P-wells.

BRIEF DESCRIPTION OF THE DRAWINGS

Further objects and features of the present invention will become apparent from the description of an illustrative embodiment thereof taken in conjunction with the accompanying drawings in which:

FIG. 8 is a cross-sectional view of the semiconductor substrate showing partial planarization of the top surface thereof and ion implantation to form an N-well;

FIG. 9 is a cross-sectional view of the semiconductor substrate after complete planarization;

FIGS. 10 and 11 are cross-sectional views of the semiconductor substrate illustrating a lift-off method of top surface planarization;

FIG. 12 is a cross-sectional view of the completed semiconductor substrate depicting an NMOS and isolated PMOS transistor pair of the CMOS circuit; and FIG. 13 is a schematic drawing of a CMOS inverter formed by the interconnections of FIG. 12.

DETAILED DESCRIPTION OF THE INVENTION

Figure 1:
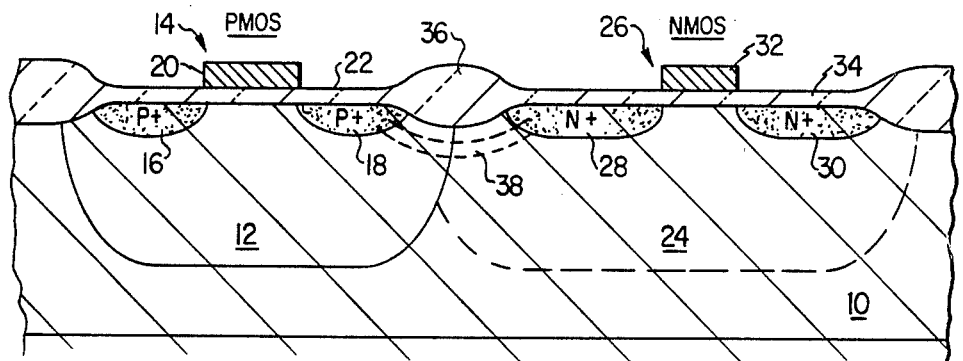
FIG. 1 is a cross-sectional view of a CMOS transistor pair formed in accordance with the twin-well technique heretofore known in the art.

FIG. 1 is illustrative of a twin-well CMOS circuit constructed in accordance with known techniques, and will be described to illustrate the problem of latch up in such prior circuits. Provided in a P-substrate 10 is a doped region 12 forming an N-well in which a PMOS transistor 14 is formed. The PMOS transistor 14 includes a P+ drain 16, a P+ source 18 and a gate 20 separated therefrom by a thin oxide layer 22. The P-substrate 10 serves as the P-well 24 in which an NMOS transistor 26 is formed. The NMOS transistor 26 includes an N+ drain 28, an N+ source 30 and a gate 32 separated therefrom by gate oxide 34. Field oxide 36 provides a surface isolation between the PMOS transistor 14 and the NMOS transistor 26. The lateral space occupied by the transistors 14 and 26 is approximately three to four microns while the field oxide 36 is required to be about eight microns wide.

For clarity, the drawings are not to scale, and the external electrical connections to the gate, drain and source regions of the transistors 14 and 26 are not shown. In accordance with the advantages of employing the CMOS technology, transistors 14 and 26 can be connected together to provide a logic inversion function.

As noted above, the twin-well design of CMOS circuit provides lateral PNPN junctions forming parasitic SCR-like devices. For example, the device identified by reference character 38 is a parasitic PNPN device formed by the P+ source 18 of transistor 14, the N-well 12, the P-well 24 and the N+ drain 28 of transistor 26. A free electron or hole with a sufficiently large mean free time is capable of triggering the parasitic SCR 38.

Another shortcoming of the illustrated twin-well CMOS device shown in FIG. 1 is that the scaling down of the circuit creates a higher probability of latch-up. By this it is meant that if the lateral distance of the noted CMOS circuit is decreased, the electrical field between the various regions increases, thereby providing more free electron holes, any one of which might be capable of triggering the parasitic SCR 38. In addition, the twin-well structure is wasteful of substrate space. As noted, the transistor devices 14 and 26 are about three to four microns in diameter, and the field oxide 36 is about eight microns wide. It is apparent that a substantial amount of substrate space is occupied by the field oxide 36 rather than the active devices which provide the desired electrical function.

FIGS. 2-14 illustrate the structure and the fabrication steps for providing a highly reliable CMOS circuit immune to latch-up in accordance with the present invention. It should be noted that the process steps set forth below for fabricating the CMOS circuit are compatible with conventional CMOS technology.

Figure 2:
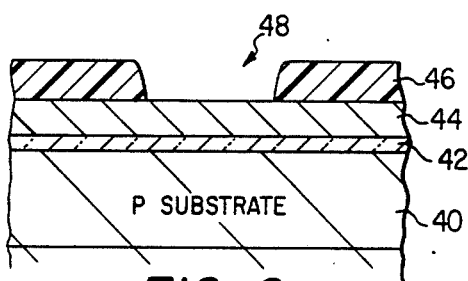
FIG. 2 is a cross-sectional view of a semiconductor substrate showing the masking process for defining the location of an isolation well.

With reference to FIG. 2, there is shown a P-substrate 40 forming the basis in which the NMOS transistor of the CMOS pair will be formed. As will be discussed in more detail below, a PMOS transistor is isolated within the P-substrate 40, and thus electrically separated from the NMOS transistor. An oxide layer 42 of about 350 angstroms thick is grown on top the P-substrate 40. The oxide layer 42 is conventionally grown in an oxygen atmosphere at a temperature of about 950 degrees centigrade.

A silicon nitride ($Si_3N_4$) layer 44 is deposited in accordance with the known low pressure chemical vapor deposition technique. The silicon nitride layer 44 is about 1400 angstroms deep. A resist 46 is spun over the silicon nitride layer 44 and patterned to form an opening 48 about three microns wide. This opening 48 forms the spatial boundary in the substrate where the PMOS transistor will be formed.

Figure 3:
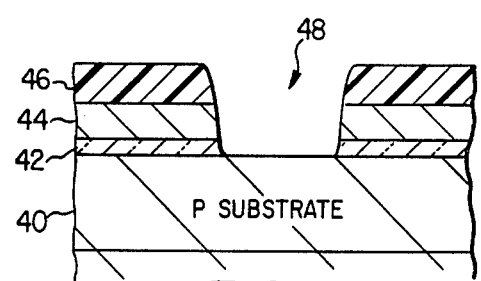
FIG. 3 is a cross-sectional view of the semiconductor substrate illustrating the exposed substrate after etching the well site area.

FIG. 3, where like and corresponding elements are identified by like reference characters, shows the semiconductor substrate after an etching process has been performed in which the nitride layer 44 and the oxide layer 42 have been etched vertically according to the boundary opening 48 established by the resist mask 46. Preferably, the nitride layer 44 and oxide layer 42 are etched by the well-known plasma etching process. Conventional gasses suitable for etching nitride and silicon oxide are utilized in the plasma. During the process step in which the nitride and oxide layers 44 and 42 are etched, the plasma species is inspected for the presence of the P-substrate material 40. Accordingly, when the P-substrate 40 begins to etch, the process is stopped.

Figure 4:
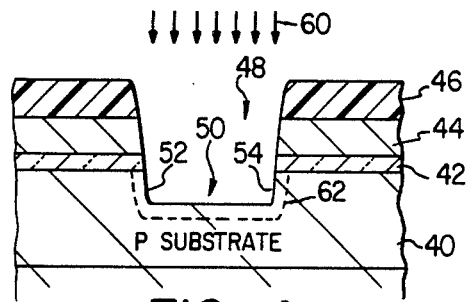
FIG. 4 is a cross-sectional view of the semiconductor substrate showing an etched well in the silicon substrate.

The second part of the two-step etching process is shown in FIG. 4. Here, the P-substrate 40 is carefully etched by a different gas through the opening 48 to a depth of about 0.5 micron by the plasma technique noted above. The two-step etch as shown in FIGS. 3 and 4 affords better control over etching of the P-substrate 40 which forms a well 50 therein. The diameter of the well 50 is approximately three microns, with sidewalls 52 and 54 tapered slightly inwardly. The parameters of the plasma etch are carefully controlled to provide the taper to the sidewalls 52 and 54 for reasons to be discussed below. The resist mask 46 is stripped from the semiconductor substrate by an acetone solution or by other suitable means.

Figure 5:
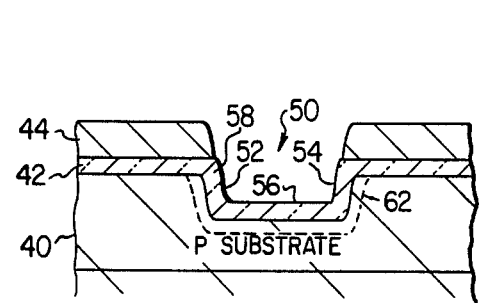
FIG. 5 is a cross-sectional view of the semiconductor substrate showing the oxide isolation wall of the well.

An oxide isolating layer 56 is grown within the well 50, as shown in FIG. 5. The isolating oxide 56 is thermally grown at a temperature of about 1000 degrees centigrade and grown to a thickness of about 2000 angstroms. In keeping with the invention, it is preferable that the silicon oxide 56 be thermally grown rather than deposited on the inside surfaces of the well 50. Thermally grown silicon oxide is of a higher quality than deposited oxide, as there are fewer defects which can give rise to charged particles or contribute to inversion of the P-substrate 40 located near the oxide-substrate boundary.

When the semiconductor substrate is thus exposed to the oxidizing environment, the silicon P-substrate 40 is consumed and the oxide layer 56 is thermally grown. As the silicon material of the P-substrate 40 is thus consumed, the well in the P-substrate enlarges, but the silicon oxide 56, which also expands, decreases the effective volume within the well 50. This aspect is shown by shoulder 58 where the thermal oxide 56 has grown inwardly. As noted in FIG. 5, the sidewalls 52 and 54 retain their tapered shape. Near the shoulder 58, the previously deposited oxide layer 42 merges with the thermal oxide 56 of the well 50 and becomes homogeneous.

Figure 6:
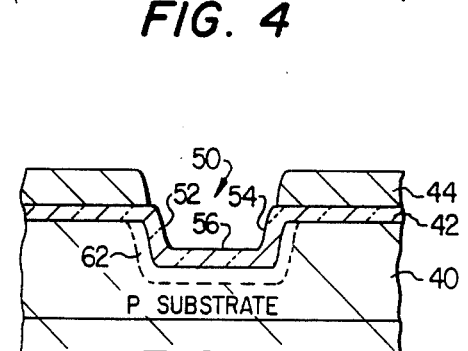
FIG. 6 is a cross-sectional view of the semiconductor substrate illustrating the formation of the boron implanted channel stop.

In keeping with the fabrication steps of the invention, the well 50 is subjected to a boron implant, after the well is etched and before the resist is removed, as shown in FIG. 4 by the arrows 60. Boron is implanted at 100 KEV with a dosage of approximately $1\times10^{12}$ atoms per square centimeter. The boron concentration within the P-substrate 40 forms a channel stop 62 between the oxide isolation 56 and the P-substrate material 40 as shown in FIG. 6. It is important to note that because the sidewalls 52 and 54 of the well 50 are tapered, some of the boron ions impact during implantation with the sidewalls and are thus implanted on the outside sidewalls of the P-substrate 40 surrounding the well 50. Of course, boron ions are also implanted on the bottom 66 of the well 50. The channel stop 62 is effective in removing parasitic channels which lead to leakage currents between the drain and source regions of NMOS transistors to be formed outside of the well 50. The top surface of the P-substrate 40 located outside of the well 50 is masked from the boron ions by the nitride layer 44.

The semiconductor substrate of the invention undergoes further processing for filling the well 50 with a semiconductor material and for planarizing the top surface of the substrate to provide a topography suitable for forming CMOS transistors therein. Resort may be had to various alternatives for accomplishing these steps.

Figure 7:
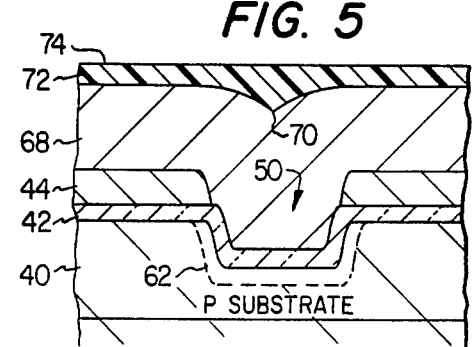
FIG. 7 is a cross-sectional view of the semiconductor substrate illustrating a polysilicon-filled isolation well.

Continuing with the process, polysilicon or amorphous silicon 68 is deposited on the surface of the semiconductor substrate. The polysilicon 68 is conformal with the topography of large wells but substantially fills wells in the diameter of three microns or less, as shown in FIG. 7. Planarization is required to remove the cusp 70 formed above the well 50.

In planarizing the top surface of the polysilicon 68 to remove the cusp 70, a photoresist is spun over the polysilicon surface according to well-known methods. The photoresist material 72 may be of the conventional type used for such purposes, so long as it can be spread over the polysilicon surface and result in a uniform smooth top surface 74. To be discussed in more detail below, it is necessary that the photoresist material 72 have an etch rate the same as that of the polysilicon 68. Conventional photoresists are available and have been used for such purposes.

A plasma reactive ion etching (RIE) technique is well adapted for planarizing the composite photoresist 72 and polysilicon 68. As noted, the photoresist material 72 and the polysilicon 68 must have an etch ratio of 1:1. With a 1:1 etch ratio, the reactive ion etching process starts at the top surface 74 of the photoresist material 72 and uniformly removes material in the downward direction. With identical etch ratios between photoresist 72 and the polysilicon 68, the etching boundary is planar and moves from the photoresist layer 72 through the cusp 70 without a change in its planar nature.

The plasma etching rate is controlled and monitored to determine when the etching boundary has reached the level shown in FIG. 8. At such level, the etching process is stopped. A phosphorous ion implantation is next conducted to convert the polysilicon 68 into an N-well 76 in which a PMOS transistor can be formed. Ion implantation is denoted by arrows 78, at an energy level 100 KEV with a dosage of $1\times10^{11}$ to $1\times10^{13}$ atoms per square centimeter. The implantation of phosphorus transforms the polysilicon 68 into the N-well semiconductor material 76 suitable for forming a CMOS transistor therein. The surface damage caused by implantation of the doped polysilicon 76 can be cured by annealing the material in a nitrogen atmosphere at a temperature of about 900 degrees centigrade. The annealing recrystalizes the silicon lattice matrix near the surface of the doped polysilicon 76 and restores the lattice to the quality substantially as good as existed before the implantation of phosphorus. Further improvement of the quality of the material can be made by annealing at an increased temperature.

In FIG. 9, it is seen that the silicon nitride masking layer 44 and the oxide layer 42 have been removed. The top surface of the doped polysilicon 76 is thus planar with that of the substrate 40. The silicon nitride layer 44 can be removed with hot phosphoric acid ($H_3PO_4$), and the oxide layer 42 by etching. As a result, the topography of the semiconductor substrate is suitable for subsequent fabrication processing which will be discussed below.

The planarization of the top surface of the semiconductor substrate can also be accomplished according to the well-known lift-off process shown in FIGS. 10 and 11. A plasma silicon or polysilicon 68 is anistropically deposited on the semiconductor substrate and doped to form the N-well 76. Anisotropic deposition can be done with electron beam evaporation techniques. As shown in FIG. 10, the anistropic deposit of silicon or polysilicon fills the well 50, and in addition, leaves deposits of silicon material overlying the silicon nitride layer 44.

The semiconductor substrate is planarized by subjecting it to a chemical solution, such as phosphoric acid, at a temperature of 160 degrees centigrade. The phosphoric acid attacks the silicon nitride layer 44 and dissolves it. The doped silicon or polysilicon 76 which was deposited on the nitride layer 44 can then be easily removed.

FIG. 11 illustrates the semiconductor substrate of FIG. 10 after the removal of the silicon or polysilicon located on the nitride layer 44. Again, the silicon or polysilicon 76 deposited within the well 50 can be recrystalized by the annealing process described above. The silicon oxide layer 42 initially grown on top of the P-substrate 40 is then removed with a chemical solution or by a plasma etching process. The semiconductor substrate then appears substantially identical to that shown in FIG. 9.

FIG. 12 illustrates the CMOS circuit constructed in accordance with the invention as above described. It is worthy to note that all PMOS transistors have been electrically isolated from the NMOS transistors thereby providing a latch-up free CMOS circuit. While the foregoing describes the fabrication steps for forming an N-material 76 in the well 50, the polysilicon or amorphous silicon 68 deposited within the well 50 could be implanted with boron to form a P-well. However, certain advantages arise from the formation of N-material 76 in well 50.

The polysilicon or amorphous silicon deposited within the well 50 is easily implant-doped as such well is on the order of 0.5 micron thick. The depositing of the polysilicon and the attendant ion implantation form a doped crystal structure which is not as ideal as that of the P-substrate 40 in which the NMOS transistor is formed. This aspect, together with the well-known fact that NMOS transistors are generally superior to PMOS transistors, makes the PMOS transistor a likely candidate for forming in the isolated well 50.

Therefore, the invention is constructed as shown in FIG. 12 with a PMOS transistor in well 50 comprising a P+ drain 82 and a P+ source 84. A PMOS transistor gate 86 provides control over the majority carriers flowing between the drain 82 and the source 84. The gate 86 can be constructed with a suitable material such as polysilicon, tungsten, or a combination thereof, or titanium silicide. A thin oxide layer 87 of only about 250 angstroms separates the drain 82 and source 84 from the gate 86 of the PMOS transistor.

The NMOS transistor is formed in the P-substrate material 40 and includes an N+ drain 88, a source 90 and a gate 92. In sharp contrast with the well-known CMOS circuit of FIG. 1, the CMOS circuit of the invention significantly economizes the substrate space by utilizing very little space for isolation between the PMOS and NMOS devices. In FIG. 12, it is to be noted that the separation between the PMOS and NMOS device is limited by the thickness of the well oxide isolation layer 56. In the preferred embodiment, the thickness of the well oxide isolation layer 56 is about 2000 angstroms, compared to the 8 microns of field oxide typically employed in accordance with the twin-well method. Moreover, the CMOS circuit of the invention can be scaled down without the concern of the generation of additional electron holes triggering parasitic SCR's. If the circuit voltages (VDD) are maintained constant, and the circuit of FIG. 12 is scaled down, the electric fields between the junctions will indeed be increased, however, the parasitic SCR's have been eliminated and thus the circuit is latch-up free.

FIG. 12 additionally shows simplified circuit connections for forming an exemplary two transistor CMOS inverter. The drain 82 of the PMOS transistor is connected to the N-well material 77, and to the supply voltage VDD. The gate 86 of the PMOS transistor is connected to the gate 92 of the NMOS transistor, which connection provides the input to the inverter circuit. The source 84 of the PMOS transistor is connected to the drain 88 of the NMOS transistor, which connection provides the output of the inverter. Lastly, the source 90 of the NMOS transistor, as well as the P-substrate 40, is connected to circuit ground or, in the alternative, to VSS (not shown).

When connected as described, the CMOS inverter of FIG. 13 is provided. In accordance with the operation of logic inverters, when the input is at a logic high, the output is driven to a logic low. Conversely, when the input is at a logic low, the output is at a logic high. Hence, with a logic high output, the PMOS transistor functions essentially as a load resistor whose quality need not be like that of the NMOS transistor, which, when saturated, presents a very low output voltage. In addition, when the NMOS transistor is cut off, it presents a high resistance to the output. It should be appreciated then, that the PMOS transistor is ideally suited for formation in the N-well 77.

It is seen from the foregoing that a CMOS fabrication method and apparatus have been provided which substantially eliminates the latch-up problem. An isolation barrier is formed between the PMOS transistors and the NMOS transistors to completely isolate the junction of such transistors and thereby eliminate the parasitic four layer SCR-like devices required for latch-up. With this arrangement, the existence of electron holes cannot contribute to latch-up. In addition, the CMOS circuit of the invention can be scaled without fear of increasing the mean free time of the electron holes which contribute to latch-up. Because the oxide isolation barrier between the PMOS and NMOS transistors forms a barrier to the charged carriers, such carriers cannot pass between the PMOS and NMOS barriers and thereby contribute to latch-up. The PMOS transistor of the CMOS pair is formed in an N-well of semiconductor material within the isolated well, as the quality of such transistor does not significantly impair the performance of the CMOS transistor pair.

Therefore, while the preferred embodiment of the methods and apparatus have been disclosed with reference to specific processes, it should be understood that many other changes in the detail may be made as a matter of engineering choice without departing from the scope of the invention as defined by the appended claims.

I claim:

1. A CMOS structure having improved latch-up immunity, comprising:
   a substrate having a crystalline surface portion on which MOS devices are formed;
   a well of polycrystalline semiconductor material disposed within said substrate and having an upper surface approximately coplanar with the surface of said substrate, said well having tapered sidewalls;
   a layer of isolating material entirely separating said semiconductor material from said substrate;
   an MOS transistor of a first conductivity type formed in said well of semiconductor material; and
   an MOS transistor of a second conductivity type formed in said surface portion of said substrate.

2. The MOS structure of claim 1, wherein said substrate includes a plurality of said wells of said polycrystalline semiconductor material, and wherein said polycrystalline semiconductor material of each well of said plurality of wells includes transistors only of said first conductivity type.

3. The CMOS structure of claim 1 wherein said first type of MOS transistor comprises a PMOS transistor.

4. The structure of claim 1, wherein said semiconductor material is entirely separated from said substrate by full oxide isolation.

5. The structure of claim 1, wherein said isolating material consists essentially of silicon dioxide.

6. The structure of claim 1, wherein said surface portion of said substrate comprises channel stops in proximity to said sidewalls of said well.

* * * * *